(12) United States Patent
Herrmann

(10) Patent No.: US 8,497,517 B2
(45) Date of Patent: Jul. 30, 2013

(54) ARRANGEMENT OF OPTOELECTRONIC COMPONENTS

(75) Inventor: Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 139 days.

(21) Appl. No.: 13/201,954

(22) PCT Filed: Mar. 8, 2010

(86) PCT No.: PCT/EP2010/052907
§ 371 (c)(1),
(2), (4) Date: Sep. 14, 2011

(87) PCT Pub. No.: WO2010/108774
PCT Pub. Date: Sep. 30, 2010

(65) Prior Publication Data
US 2012/0025219 A1    Feb. 2, 2012

(30) Foreign Application Priority Data
Mar. 27, 2009   (DE) .......................... 10 2009 015 307

(51) Int. Cl.
*H01L 33/00* (2010.01)
(52) U.S. Cl.
USPC ........................................... 257/88; 257/686

(58) Field of Classification Search
None
See application file for complete search history.

(56) References Cited

U.S. PATENT DOCUMENTS

| | | |
|---|---|---|
| 2002/0017710 A1 | 2/2002 | Kurashima et al. |
| 2005/0189640 A1 | 9/2005 | Grundy et al. |
| 2007/0176193 A1 | 8/2007 | Nagai |
| 2008/0217630 A1 | 9/2008 | Plank |
| 2011/0101383 A1 | 5/2011 | Herrmann |

FOREIGN PATENT DOCUMENTS

| | | |
|---|---|---|
| DE | 20 2006 005 045 U1 | 9/2007 |
| DE | 10 2007 041 896 A1 | 3/2009 |
| DE | 10 2008 049 777 A1 | 11/2009 |
| DE | 10 2008 025 693 A1 | 12/2009 |
| EP | 1 968 115 A2 | 9/2008 |
| JP | 2007-115928 A | 5/2007 |

OTHER PUBLICATIONS

E. Fred Schubert, "Light-Emitting Diodes," Second Edition, New York: Cambridge University Press, 2006, pp. 194-195.

*Primary Examiner* — Thien F Tran
(74) *Attorney, Agent, or Firm* — DLA Piper LLP (US)

(57) ABSTRACT

An arrangement includes at least two optoelectronic individual elements. At least two of the individual elements overlap partially in a lateral direction. Indirect or direct electrical contacting between the at least two laterally overlapping individual elements is brought about by at least one conductor track on a carrier top of the one individual element and by at least one conductor track on a carrier bottom of the other individual element.

17 Claims, 7 Drawing Sheets

ARRANGEMENT OF OPTOELECTRONIC COMPONENTS

RELATED APPLICATIONS

This is a §371 of International Application No. PCT/EP2010/052907, with an international filing date of Mar. 8, 2010 (WO 2010/108774 A1, published Sep. 30, 2010), which is based on German Patent Application No. 10 2009 015 307.1, filed Mar. 27, 2009, the subject matter of which is incorporated by reference.

TECHNICAL FIELD

This disclosure relates to an arrangement of optoelectronic components which allows efficient electrical contacting of the components.

SUMMARY

I provide an arrangement of optoelectronic components including at least two individual optoelectronic elements, wherein at least one active semiconductor layer sequence is applied in a sub-zone of a carrier top of a carrier of the individual elements, at least one electrical conductor track is applied to the carrier top and at least one electrical conductor track is applied to a carrier bottom of the carrier, at least one of the conductor tracks on the carrier top extends into at least one connection zone not covered by the semiconductor layer sequence, and at least the at least one conductor track on the carrier bottom extends into the sub-zone, at least one of the conductor tracks on the carrier top is connected electrically to the conductor track on the carrier bottom by way of at least one via, wherein at least two of the individual elements overlap partially in a lateral direction, and at least indirect electrical contacting between at least two of the laterally overlapping individual elements is brought about by at least one of the conductor tracks on the carrier top of the one individual element and by the at least one conductor track on the carrier bottom of the other individual element.

DETAILED DESCRIPTION

The arrangement may comprise at least two individual optoelectronic elements. The arrangement preferably comprises a plurality of individual elements, for example, more than eight individual elements, in particular more than 30 individual elements. The individual elements of the arrangement may each be identical individual elements. It is likewise possible for the arrangement to comprise at least two different types of individual elements.

The individual elements may each comprise a carrier with a top of the carrier (also referred to as "carrier top"). The carrier preferably exhibits high thermal conductivity. The carrier may be made of a dielectric or high-resistance material. For example, the carrier contains or consists of silicon, a ceramic such as aluminium nitride or aluminium oxide, a glass or a plastics material. It is likewise possible for the carrier to comprise a metal-core board. The thickness of the carrier is preferably between 25 µm and 1 mm inclusive, in particular between 50 µm and 500 µm inclusive, for example, between 70 µm and 250 µm inclusive.

At least one radiation-emitting, active semiconductor layer sequence may be applied in a sub-zone on the top of the carrier of the individual elements. Different individual elements may contain different active semiconductor layer sequences. For example, some of the individual elements comprise an active semiconductor layer sequence emitting in the blue spectral range and other individual elements include active semiconductor layer sequences emitting in the red and green spectral ranges. In particular, all the individual elements of the arrangement may be of identical configuration except for the semiconductor layer sequence.

The active semiconductor layer sequence may cover only a part of the carrier top. In a direction perpendicular to the carrier top, a sub-zone is defined by the active semiconductor layer sequence. In other words, the sub-zone, when the top of the carrier is viewed in plan view, is the zone which is covered by the active semiconductor layer sequence.

In each case at least one, in particular at least two electrical conductor tracks may be applied to the top of the carrier of the individual elements. The active semiconductor layer sequence is contacted electrically via the conductor tracks on the carrier top.

At least one electrical conductor track may be applied to a bottom of the carrier (also referred to as "carrier bottom"). Preferably neither the conductor track on the carrier bottom nor the conductor tracks on the carrier top opposite the carrier bottom extends onto end faces of the carrier. In other words, the end faces of the carrier are free of the conductor tracks.

At least one of the conductor tracks on the carrier top may be connected electrically to the or one of the conductor tracks on the carrier bottom by at least one via. If two or more electrical conductor tracks are applied to each of the carrier top and the carrier bottom, each one of the conductor tracks on the carrier top is preferably connected electrically to one of the conductor tracks on the carrier bottom by one or more vias.

At least one of the conductor tracks on the carrier top may extend into at least one connection zone. The at least one connection zone is in this case, when the carrier top is viewed in plan view, a zone of the individual element which is not covered by the active semiconductor layer sequence. In other words, the connection zone and the sub-zone in which the active semiconductor layer sequence is applied do not overlap in a lateral direction. Both the sub-zone and the at least one connection zone extend over the entire individual element in a direction perpendicular to the carrier top. When the carrier top is viewed in plan view, the connection zone or each of the connection zones is a continuous area.

The at least one conductor track may extend on the carrier bottom into the sub-zone. In other words, in plan view the conductor track on the carrier bottom and the active semiconductor layer sequence overlap at least in places.

At least two of the individual elements of the arrangement may overlap in a lateral direction. The individual elements thus partially cover one another when the carrier tops of the individual elements are viewed in plan view and/or when the arrangement is viewed in plan view.

At least two of the individual elements of the arrangement may be connected together electrically by at least one of the conductor tracks on the carrier top of the one individual element and by the at least one conductor track on the carrier bottom of the other individual element.

The at least two laterally overlapping individual elements may be indirectly or directly electrically contacted with one another. This may mean that only solder or an electrically conductive adhesive is situated between the conductor tracks to be connected of the individual elements, the electrical connection between the conductor tracks being brought about by the solder or the adhesive. It is likewise possible for the conductor tracks requiring connection to be in direct physical contact with one another and for the connection to be made by melting or partially melting at least one of the conductor tracks requiring connection and/or by exposure to pressure. The connection between the at least two laterally overlapping individual elements is in particular free of electrical bridges or bonding wires.

The arrangement may comprise at least two optoelectronic individual elements. At least one active semiconductor layer sequence is applied in each case in a sub-zone of the top of a carrier of the individual elements. In addition, at least one, in particular at least two electrical conductor tracks are applied to the carrier top and at least one electrical conductor track is applied to a bottom of the carrier opposite the carrier top. At least one of the conductor tracks on the carrier top extends into a connection zone of the individual element which is not covered by the active semiconductor layer sequence. In addition, the at least one conductor track extends on the carrier bottom in the sub-zone which is covered by the active semiconductor layer sequence. An electrical connection between at least one of the conductor tracks on the carrier top and the at least one conductor track on the carrier bottom is effected by at least one electrical via through the carrier. At least two of the individual elements overlap partially in a lateral direction. Indirect or direct electrical contacting between the at least two laterally overlapping individual elements is brought about by at least one of the conductor tracks on the carrier top of the one individual element and by the at least one conductor track on the carrier bottom of the other individual element.

Through the overlapping arrangement of the individual elements, an arrangement may be produced, for example, which has a high luminance, since the individual elements and the active semiconductor layer sequences may be tightly packed in a lateral direction.

At least two of the individual elements may comprise at least two conductor tracks on the carrier bottom. These individual elements preferably then comprise precisely two conductor tracks on the carrier top and precisely two conductor tracks on the carrier bottom.

At least two of the individual elements of the arrangement, which are in direct electrical contact with one another, may be connected electrically in parallel. Preferably, at least two of the individual elements comprise precisely one conductor track on the carrier bottom and precisely two conductor tracks on the carrier top.

At least two of the individual elements, which are electrically in direct contact with one another, may be connected electrically in series.

The individual elements may be mounted on a common mounting support. The mounting support may be a printed circuit board and/or a heat sink. Preferably, only some of the individual elements are in direct electrical contact with the mounting support.

The mounting support may comprise a stepped structure. At least two of the individual elements of the arrangement are mounted on the stepped structure. Preferably, at least some of the individual elements lie on or against the stepped structure of the mounting support. In other words, the individual elements are arranged in steps and the stepped structure of the mounting support is conformed to the stepped arrangement of the individual elements.

At least two of the individual elements may be arranged obliquely relative to the mounting surface of the mounting support. For example, the mounting surface is of planar construction, within the bounds of manufacturing tolerances. An angle between the mounting surface and the carrier bottom is then thus different from 0° and different from 90°. Preferably, the angle between the carrier bottom and the mounting surface is between 0.75° and 30° inclusive, in particular between 1° and 10° inclusive.

The carrier bottoms of at least two, preferably of all the individual elements may be in contact only in places with the mounting surface of the mounting support.

The arrangement may comprise a plurality of individual elements. Furthermore, at least some of the individual elements are arranged next to one another in at least two rows. Each of the rows in this case comprises preferably at least two, in particular at least four of the individual elements. Arranged in rows may mean that individual elements of the respective rows do not overlap one another in a lateral direction. Each of the rows may, for example, be separately electrically driven or connected separately electrically with the mounting support.

All the individual elements may be of identical construction and identically oriented, in particular within the bounds of manufacturing tolerances. In other words, all the individual elements are of like construction and are arranged relative to one another such that three main axes of each of the individual elements are in each case oriented parallel to one another.

The arrangement may comprise a plurality of individual elements. At least some of the individual elements or all the individual elements are arranged in the manner of shingles. In the manner of shingles may in this case mean that one individual element overlaps with at least two further individual elements in a lateral direction. In the region of the shingle-like arrangement, the entire mounting surface of the mounting support is preferably covered by the individual elements. When the arrangement is viewed in plan view, the mounting surface inside the arrangement is then preferably not freely accessible. In other words, the individual elements are arranged like roof tiles on a house roof.

The degree of overlap of the individual elements may amount to between 5% and 60% inclusive, preferably between 10% and 45% inclusive. In other words, an overlap zone in which the adjoining individual elements overlap one another takes up a proportion of the carrier top within the stated value range.

The arrangement may comprise at least three individual elements. Two of the three individual elements are arranged adjacent one another in a lateral direction. Furthermore, the third individual element is contacted electrically by the first two individual elements. The third individual element overlaps the connection zones of the first two individual elements.

The arrangement may comprise at least three individual elements with longitudinal axes oriented parallel to one another. Two of the individual elements adjoin one another in a flush manner in a direction perpendicular to the longitudinal axes. A center line is defined by a connecting line between these individual elements. When the arrangement is viewed in plan view, the center line lies congruently over the longitudinal axis of the third individual element within the bounds of manufacturing tolerances. In other words, the third individual element overlaps the first two individual elements in a centered manner.

The active semiconductor layer sequence of at least two of the individual elements may take up a proportion of the area of the top of the carrier of between 40% and 95% inclusive, preferably between 45% and 80% inclusive, in particular between 60% and 90% inclusive.

The arrangement may comprise at least two individual elements, in which at least two end faces of the active semiconductor layer sequence adjoin the at least one connection zone. The individual elements may in this case comprise precisely one connection zone or a plurality of connection zones.

At least two individual elements may comprise at least two, in particular precisely two connection zones.

The arrangement may comprise at least two individual elements, the carrier being different from a growth substrate of the active semiconductor layer sequence.

The active semiconductor layer sequence may have a thickness, in a direction perpendicular to the carrier top, of at most 40 µm, in particular of at most 20 µm, preferably of at most 12 µm. In other words, the active semiconductor layer sequence may be a thin film chip.

The active semiconductor layer sequence may take the form of a light-emitting diode, LED for short.

At least two of the individual elements may comprise a conversion medium, which is in each case arranged downstream of the active semiconductor layer sequences in a direction of emission.

The carrier of at least two of the individual elements may comprise a triangular, rectangular or hexagonal outline. For example, the carrier takes the form of an equilateral triangle or equilateral hexagon.

The individual elements may be arranged symmetrically relative to at least one plane of symmetry. A plane of symmetry is, for example, a plane perpendicular to the mounting surface of the mounting support. In other words, the individual elements may assume a regular, in particular matrix-like arrangement. "Matrix-like" may mean that the individual elements are arranged in columns and rows and/or at the lattice sites of a regular lattice.

The arrangement may include an optical component arranged downstream of the active semiconductor layer sequences in the direction of emission. The optical component may comprise sub-components, such that, for example, one of the sub-components of the optical component is associated with each of the individual elements.

At least two of the individual elements may include an electronic component. The electronic component may be an integrated circuit or IC. It is likewise possible for the electronic component to include a sensor, for example, for temperature, moisture, brightness and/or operating hours. It may also be possible to address the individual elements via the integrated circuit. Furthermore, the electronic component may be configured as protection against electrostatic discharge or ESD. The electronic component then includes a Schottky diode or a Zener diode, for example.

The at least one electronic component may extend at least in part into the connection zone. When the individual element carrier is viewed in plan view, the electronic component is not covered or partially not covered by the active semiconductor layer sequence.

The electronic component may be integrated at least partially into the carrier. The carrier is then preferably based on silicon and the integrated circuit is made using conventional silicon technology, for example.

At least two of the individual elements may comprise a trimming resistor. The trimming resistor is designed to adjust energization of the active semiconductor layer sequence individually for the individual elements. The trimming resistor makes it possible for the luminous intensity of different individual elements and thus in particular a color location of the radiation of the entire arrangement to be adjusted, in particular even after production of the arrangement. Looking at the carrier top, the trimming resistor is preferably freely accessible at least in places. The trimming resistor may be integrated into the electronic component of the individual elements.

For example, the trimming resistor is formed by a set of parallel connected, exposed conductor track sections. "Set" may mean that the conductor track fans out into at least three conductor track sections. The conductor track sections may be arranged parallel to one another. Preferably, each of the conductor track sections has a cross-section which is smaller than the cross-section of the conductor track itself. In particular, the conductor track sections may each have mutually different cross-sections. By severing in particular at least one of the conductor track sections, the magnitude of the trimming resistor may then be increased to a desired value. Severing is performed, for example, mechanically, chemically or photochemically.

The individual elements comprising the electrical components may assemble to yield an overall system for an electrical circuit, in particular a drivable display means. In other words, the overall system does not, for example, need a separate control unit. Driving of the active semiconductor layer sequences is then in particular taken over by the electrical components of the individual elements themselves.

An arrangement described herein is explained in greater detail below by examples with reference to the drawings. Elements which are the same in the individual figures are indicated with the same reference numerals. The relationships between the elements are not shown to scale, however, but rather individual elements may be shown exaggeratedly large to assist in understanding.

Figure 1:
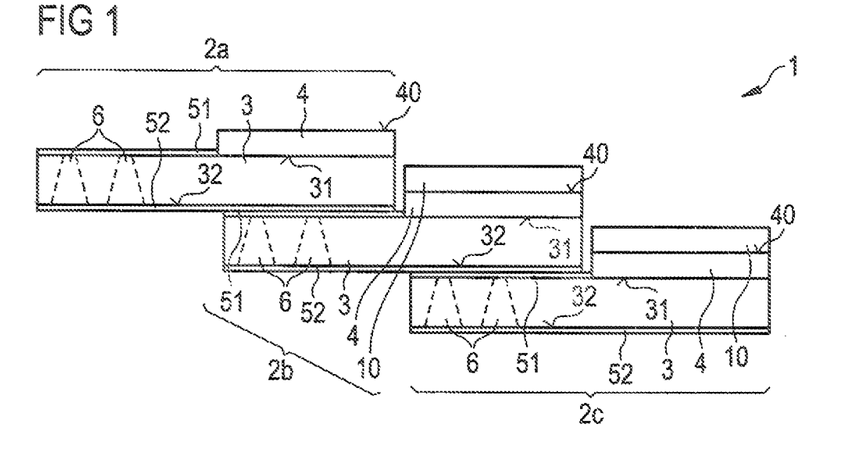
FIG. 1 is a schematic side view of an example of an arrangement described herein.

FIG. 1 shows an example of an arrangement 1 in side view. The arrangement 1 comprises, for example, three individual elements 2a-c arranged in the manner of stairs. "In the manner of stairs" means in this case that the individual elements overlap partially in the lateral direction and are offset relative to one another in a direction orthogonal thereto. Each of the individual elements 2a-c comprises a carrier 3 with a carrier top 31 and a carrier bottom 32 opposite thereto, cf. also FIG. 2. An outline of the carrier 3 is rectangular. Two conductor tracks 51 are applied to the carrier top 31. The conductor tracks 51 enable electrical contacting of an active semiconductor layer sequence 4 with a thickness of, for example, around 12 µm, in a direction perpendicular to the carrier top 31. The semiconductor layer sequence 4 is applied to the carrier top 31 in a sub-zone 30. In a lateral direction the semiconductor layer sequence 4 is defined by end faces 45.

The semiconductor layer sequence 4 may take the form of a "flip chip," such that electrical connection zones of the semiconductor layer sequence 4 are situated in particular on one major side of the semiconductor layer sequence 4 facing the carrier 3. It is likewise possible for the electrical connection zones of the semiconductor layer sequence 4 to be situated on the two mutually opposing major sides of the semiconductor layer sequence 4. In this case, one of the conductor tracks 51 preferably contacts the connection zone facing the carrier 3 and the further conductor track 51 preferably contacts the connection zone remote from the carrier 3 at a radiation passage face 40.

Figure 2:
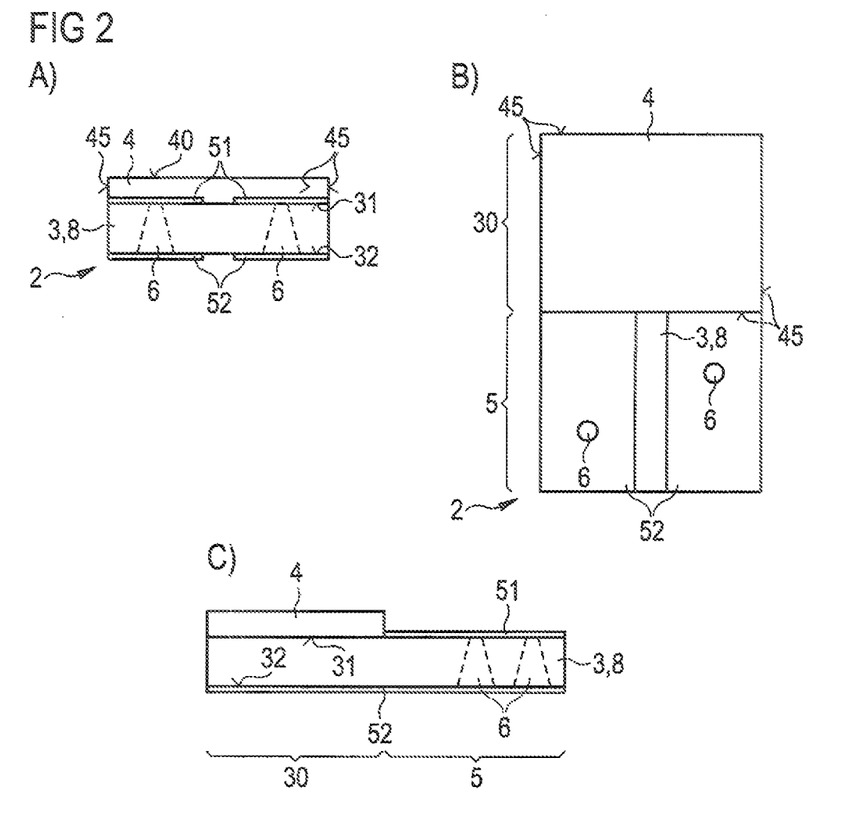
FIG. 2 shows a schematic front view (A), a schematic plan view (B) and a schematic side view (C) of one example of an individual element described herein.

Two conductor tracks 52 are likewise situated on the carrier bottom 32. The conductor tracks 52 extend, in a longitudinal direction, over the entire carrier bottom 32, cf. the side view according to FIG. 2C. Each of the conductor tracks 51 on the carrier top 31 is connected to one of the conductor tracks 52 on the carrier bottom 32 by means of an electrical via 6. To increase the mechanical stability of the carrier 3 the vias 6 are arranged staggered in the longitudinal direction, cf. the plan view of the individual element 2 according to FIG. 2B.

The individual elements 2a-c are connected electrically in parallel. The conductor tracks 52 on the carrier bottom 32 are, for example, soldered, welded or adhesively bonded in electrically conductive manner to the conductor tracks 51 on the carrier top 31 of the subsequent individual element. The individual elements 2a-c are thus electrically connected immediately or directly together.

In each case a sub-region of the individual elements 2a-c which is not covered by the semiconductor layer sequence 4 when viewed in plan view constitutes an electrical connection zone 5. The individual elements 2a-c are arranged such that the sub-zone 30 of one of the individual element overlaps with the connection zone 5 of the subsequent individual element.

A conversion medium 10 may optionally be applied to the radiation passage face 40 of one or one of two of the individual elements 2b, c. The thickness of the conversion medium 10, in a direction perpendicular to the radiation passage face 40, amounts, for example, to around 10 µm to 20 µm. The thickness of the semiconductor layer sequence 4 is, for example, around 6 µm. The thickness of the carrier, which is in particular based on silicon or made of silicon, is, for example, around 250 µm inclusive of the conductor tracks 51, 52.

Lateral dimensions of the carriers of the individual elements are, for example, between 0.3 mm×1 mm and 3 mm×6 mm inclusive. The proportion of the carrier top 31 which is covered by the semiconductor layer sequence 4 is, for example, around 50%.

Figure 3:
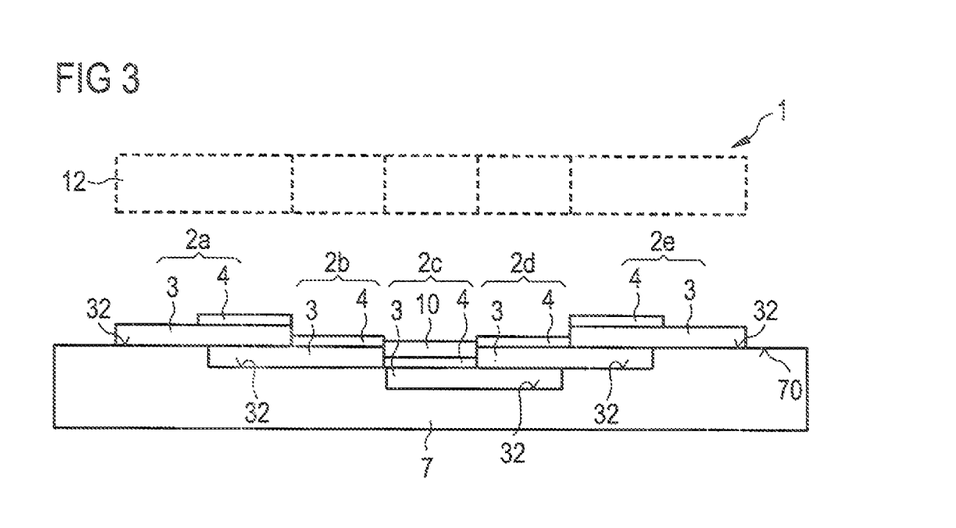
FIGS. 3 to 9 are schematic representations of further examples of arrangements described herein.

FIG. 3 shows a schematic side view of a further example of the arrangement 1. The individual elements 2 have been placed on a mounting surface 70 of a mounting support 7. The mounting surface 70 is of stepped structure, i.e., the mounting surface 70 comprises a plurality of plateaus offset relative to one another in a direction perpendicular to the mounting surface 70. The individual elements 2a-e are arranged in form-fitting manner on this stepped structure of the mounting support 7. The mounting support 7 is a metal-core board, for example.

To electrically contact the individual elements 2a-e, the mounting support 7 comprises electrical conductors, not shown in FIG. 3. For example, a group of the individual elements 2a, b is connected electrically in series, as is a group of the individual elements 2c-e. The two groups of the individual elements 2a, b and the individual elements 2c-e may in turn be connected electrically in parallel. The individual element 2d is in this case not contacted electrically by way of the mounting support 7, but rather solely by way of the individual elements 2c, 2e.

Through the stepped arrangement of the individual elements 2a-c, no or only a negligibly small proportion of the radiation generated by one of the semiconductor layer sequences 4 may reach another semiconductor layer sequence 4 or another conversion medium 10.

An optical component 12 is optionally arranged downstream of the individual elements 2a-e in the direction of emission. The optical component 12 spanning the individual elements 2a-e may additionally comprise sub-components, such that precisely one of the sub-components of the optical component 12 is, for example, associated with each of the individual elements 2a-e. The individual elements 2a-e are at different distances, in a direction perpendicular to the mounting surface 70, from the optical component 12. This makes it possible for different wavelength ranges to be focused or widened to different degrees by the optical component 12 or its sub-components, if the individual elements 2a-e generate radiation in different wavelength ranges.

Figure 4:
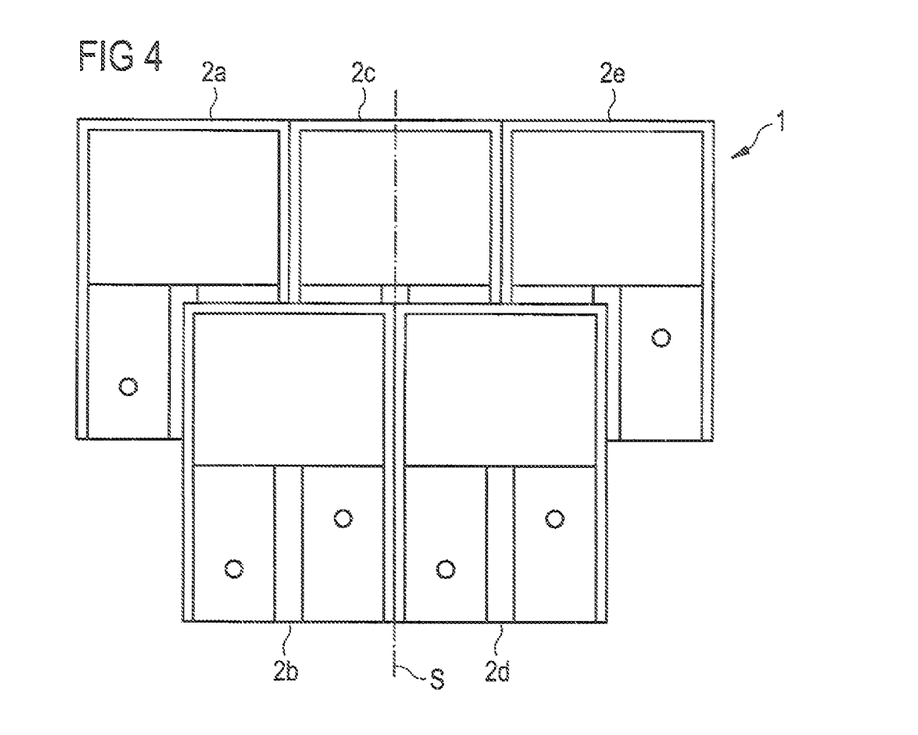

In the example of the arrangement 1 according to FIG. 4, the individual elements 2a-e are arranged in the manner of shingles. The arrangement has a plane of symmetry S, which constitutes a mirror plane relative to the positions and orientations of the individual elements 2a-c.

The individual elements 2a-e are connected electrically in series. Current flows from the individual element 2a to the individual element 2b, on to the individual element 2c and from there via the individual element 2d to the individual element 2e. The individual elements 2a-c are configured, for example, as shown in FIG. 2.

Figure 5:
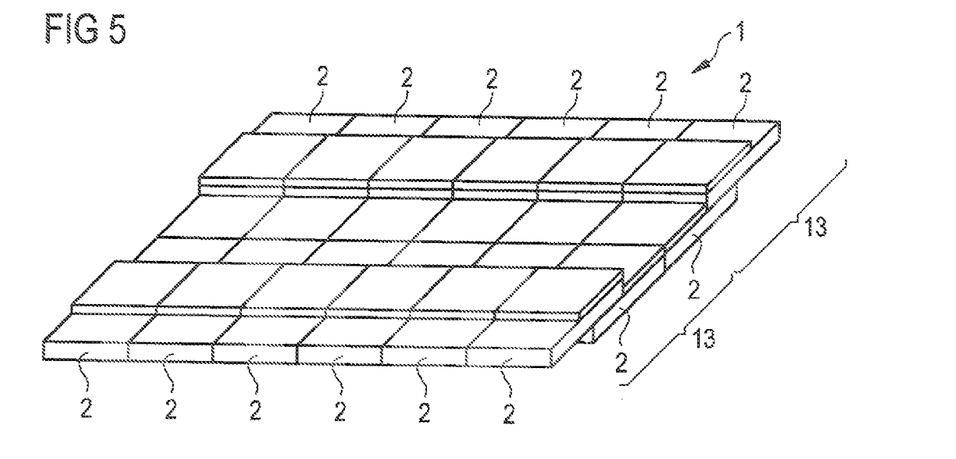
Figure 6:
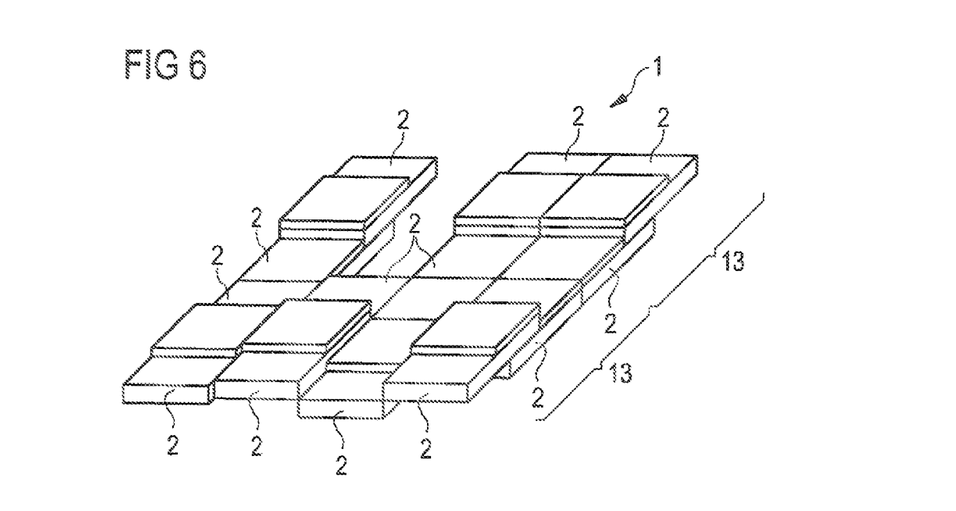

FIGS. 5 and 6 are schematic three-dimensional representations of the arrangements 1. A mounting support, on which the individual elements 2 are optionally mounted, is not shown in FIGS. 5 and 6. The individual elements 2 are arranged in continuous or interrupted double rows 13. Within a double row 13 at least two of the adjoining individual elements 2 overlap in each case in stepped manner.

Figure 7:
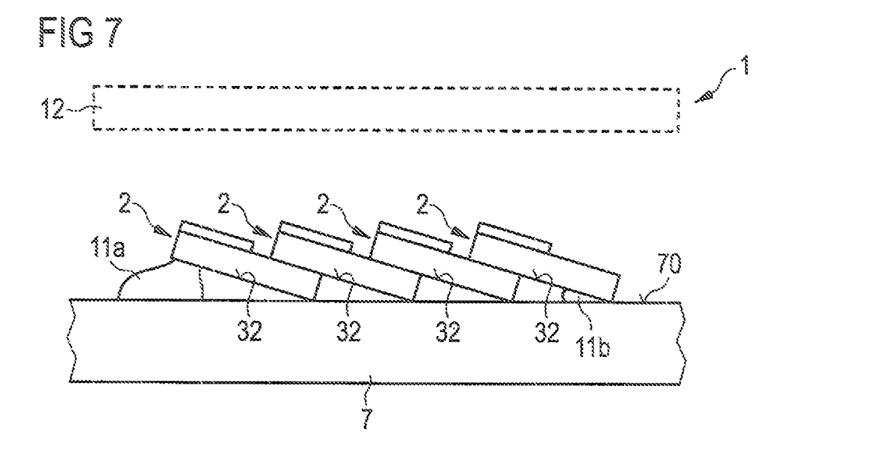

In the arrangement 1 according to FIG. 7, the individual elements 2 are arranged obliquely relative to the mounting surface 70 of the mounting support 7. In other words, the carrier bottoms 32 form an angle of preferably a few degrees with the mounting surface 70 which is of planar configuration within the bounds of manufacturing tolerances. The individual elements 2 are, for example, all connected electrically in parallel or in series. The individual elements 2 are contacted electrically via soldering points 11a, 11b.

To improve thermal conductivity from the individual elements 2 to the mounting support 7, it is optionally possible for an electrically insulating heat conductive paste, not shown in FIG. 7, to be situated or for a cooling liquid to circulate between the individual elements 2 and the mounting surface 70. The optical component 12 may optionally likewise be mounted over the individual elements 2, spanning all the individual elements 2. All the individual elements 2 are approximately at the same distance from the optical component 12.

Figure 8:
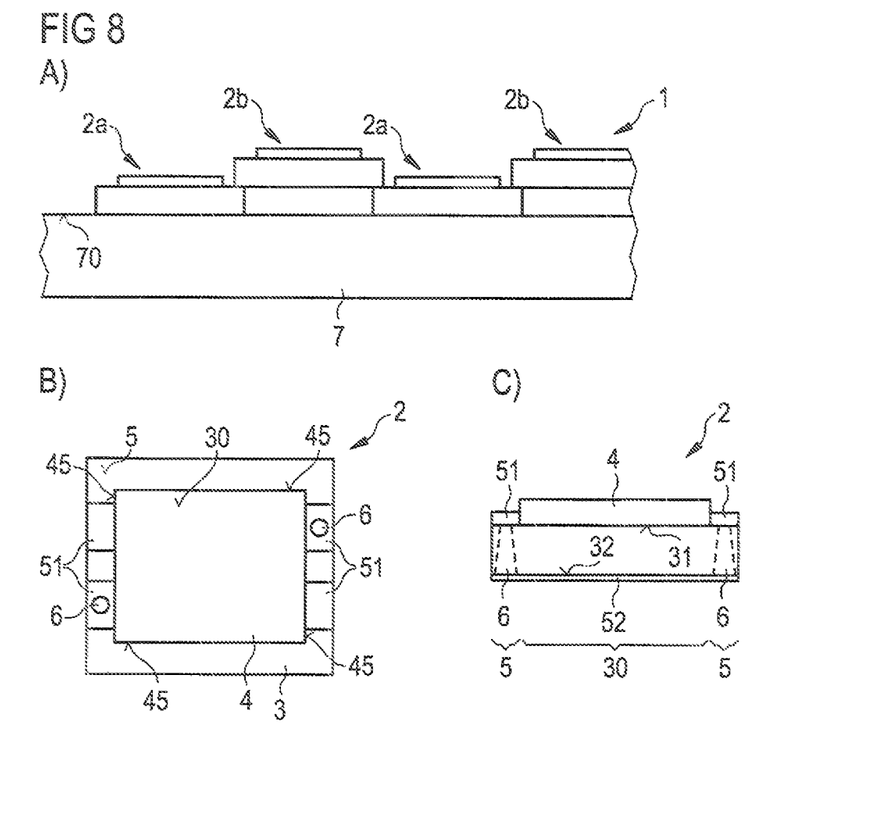

The arrangement 1 according to FIG. 8A comprises two layers of individual elements 2a, 2b. The individual elements 2a are placed directly on the mounting surface 70. The individual elements 2b are at a greater distance from the mounting surface 70 and rest in each case on at least two of the individual elements 2a located closer to the mounting surface 70. Optionally, one or more of the individual elements may also be mounted on a major side of the mounting support 7 remote from the mounting surface 70.

FIG. 8B shows a plan view and FIG. 8C a schematic side view of the individual elements 2 of FIG. 8A. The individual elements 2 have an approximately square outline. The semiconductor layer sequence 4, by which the sub-zone 30 is defined, is likewise approximately square and covers a central part of the carrier 3. Thus, a peripheral area of the carrier 3, which constitutes the connection zone 5, is not covered by the semiconductor layer sequence 4. The electrical conductor tracks 51 on the carrier top 31 are applied to mutually opposing peripheral regions of the top 31 of the carrier 3.

Unlike what is shown in FIG. 8B, the conductor tracks 51, 52 on the carrier top 31 and/or on the carrier bottom 32 may also extend on more than two peripheral regions of the carrier top 31 or the carrier bottom 32. For example, the conductor tracks 51, 52 may be L-shaped or T-shaped or cross-shaped. The arrangement 1 may also contain individual elements 2 with differently configured electrical conductor tracks 51, 52.

It is furthermore possible for the conductor tracks 51 on the carrier top 31 in particular to be capable of subsequent processing after mounting of the individual elements 2 on the mounting support 7. For example, parts of the conductor tracks 51 may be subsequently removed or severed mechanically or by exposure to light.

Figure 9:
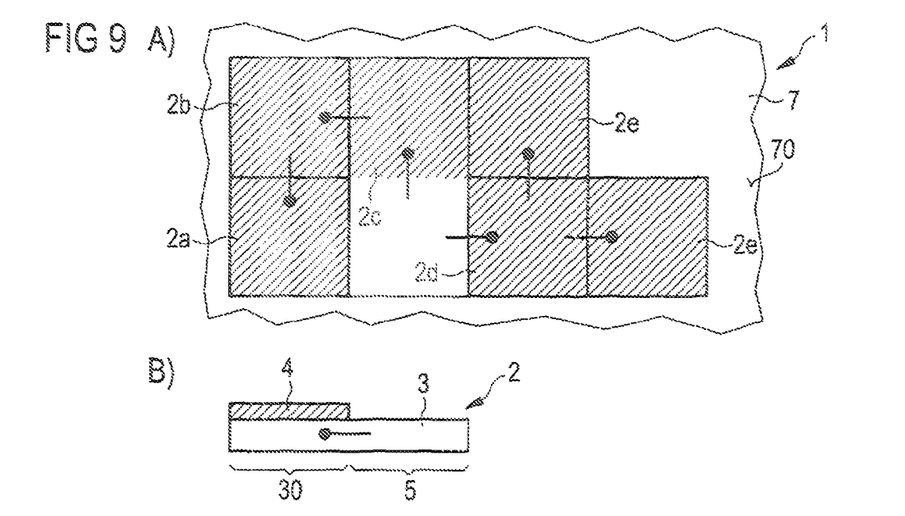

FIG. 9A is a plan view of a further example of the arrangement 1. The individual elements 2a-e are in each case shown only schematically. In particular, the individual elements 2a-2e are symbolized by a line with a head, cf. FIG. 9B. The head of the line here symbolizes the sub-zone 30 with the semiconductor layer sequence 4, and the part of the line extending away from the head symbolizes the connection zone 5.

The individual elements 2a-e overlap and are rotated by 90° relative to one another. For example, the individual element 2a is situated directly on the mounting surface 70. In the direction away from the mounting support 7 the connection zone 5 of the individual zone 2a is covered by the sub-zone 30 of the individual element 2b. The same is true of the individual elements 2b, 2c. In the direction towards the mounting support 7 the connection zone 5 of the individual element 2d is situated below the connection zone 5 of the individual element 2c. Furthermore, the connection zones 5 of the two individual elements 2e are situated below the sub-zone 30 of the individual element 2d. In the sub-zone 30 of the individual element 2d three of the individual elements 2d, 2e are thus situated above one another in a direction perpendicular to the mounting surface 70. As a result of such an arrangement of the individual elements 2a-e, the majority of or the entire mounting surface 70 may be covered by the sub-zones 30. In this case, none of the sub-zones 30 cover one another.

It is optionally possible for a sensor, for example, for brightness and/or temperature, to be mounted in the connection zone 5 of the individual element 2c not covered by any of the individual elements 2a, 2b, 2d, 2e.

To simplify the graphic representation, the arrangements 1 in FIGS. 1, 3 to 7, 8A and 9A are illustrated with in each case only a comparatively small number of individual elements 2. The arrangements 1 may, however, each comprise more individual elements 2.

FIGS. 10 to 13 show examples of the individual elements 2, as may be used, for example, in arrangements 1 similar to FIGS. 1, 3 to 7, 8A and 9A. The individual element 2 according to FIG. 10 comprises just one conductor track 52 on the carrier bottom 32, see the plan view in FIG. 10A and the side view in FIG. 10B. The conductor track 51b on the carrier top 31, which is connected to the conductor track 52 on the carrier bottom 32 by way of the via 6, occupies only a small part of the carrier top 31. In contrast, the conductor track 51a on the carrier top 31 is L-shaped and covers a major part of the connection zone 5.

Figure 11:
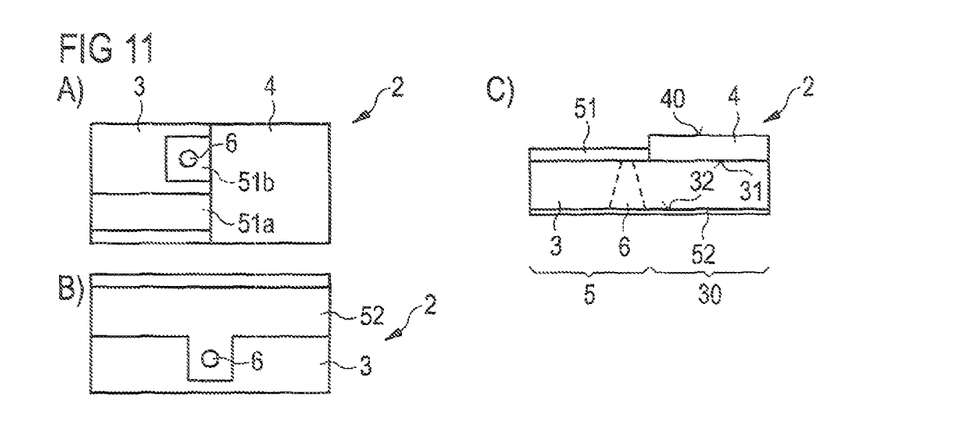

In the example according to FIG. 11 the conductor tracks 51a on the carrier top 31 and the conductor track 52 on the carrier bottom 32 are situated one above the other in plan view, cf. the plan view in FIG. 11A, the view from below in FIG. 11B and the side view in FIG. 11C. The conductor track 51b is again connected to the conductor track 52 on the carrier bottom 32 by way of the via 6.

Figure 10:
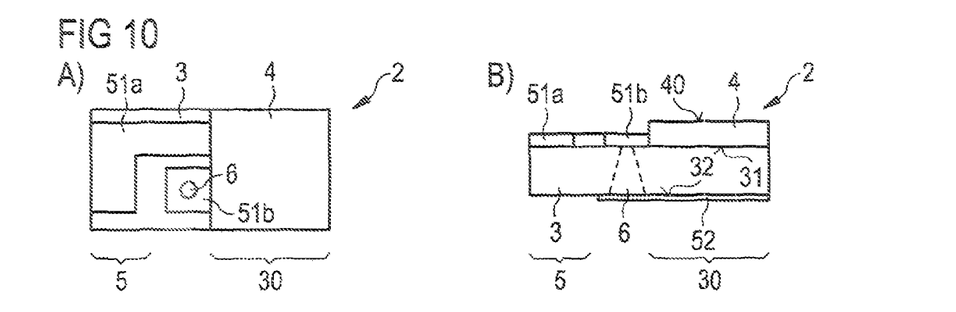
FIGS. 10 to 14 are schematic representations of further examples of individual elements described herein.

Unlike in FIGS. 10 and 11 it is possible for the via from the conductor track 51b to the conductor track 52 on the carrier bottom 32 to be situated below the semiconductor layer sequence 4 when viewed in plan view.

Figure 12:
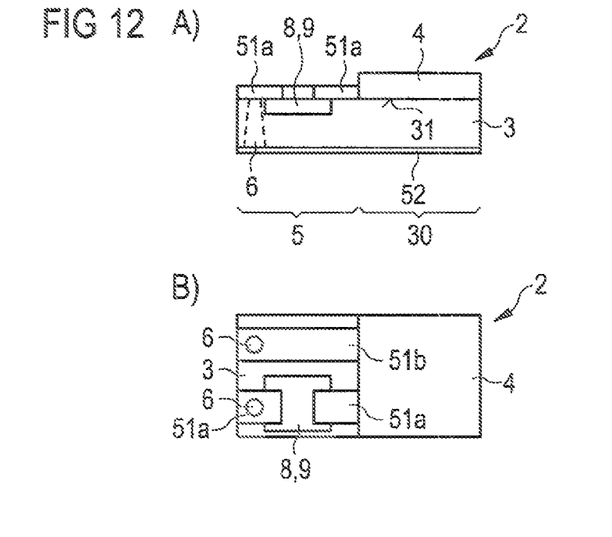

In the example according to FIG. 12 an electronic component 8, for example, with a Schottky diode or a Zener diode, and/or a trimming resistor 9 is integrated into the carrier 3, see the plan view according to FIG. 12B. The trimming resistor 9 and/or the electronic component 8 are freely accessible at least in places when viewed from the carrier top 31, such that the trimming resistor 9 may also be modified after mounting of the individual element 2 in the arrangement 1. The conductor track 51b is of continuous configuration. The conductor track 51a is interrupted, such that the two parts of the conductor track 51a are connected in series with the electronic component 8 and/or the trimming resistor 9. The conductor track 51b is not shown in the side view according to FIG. 12A.

The individual elements 2 according to FIGS. 1 to 11 may also each comprise an electronic component 8 and/or a trimming resistor 9.

Figure 13:
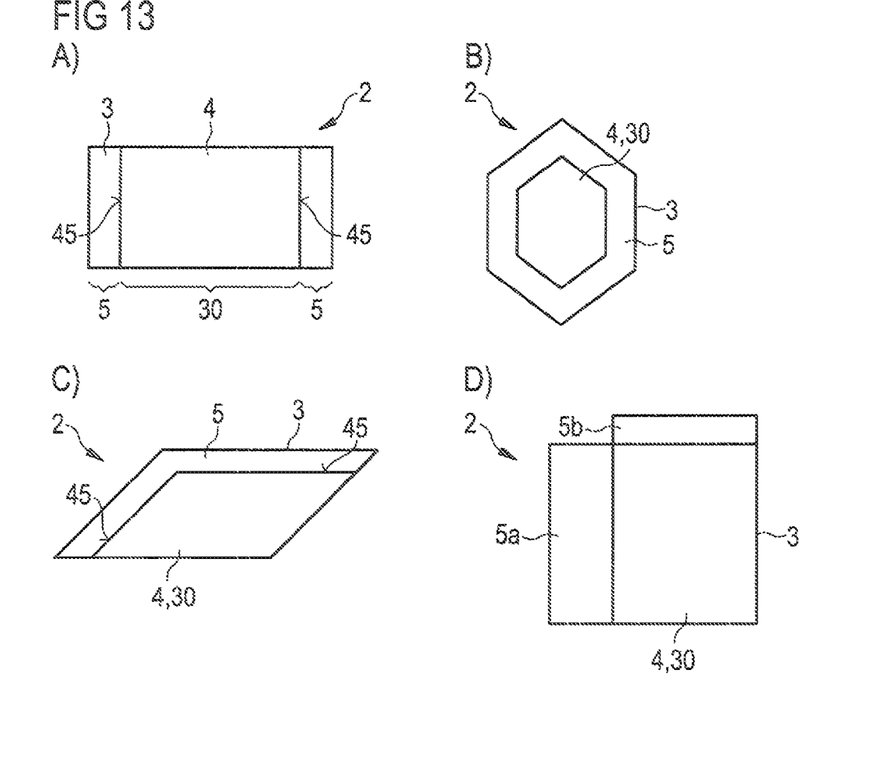

FIG. 13 shows further examples of individual elements 2 in plan view. In FIG. 13 the conductor tracks 51, 52 are in each case not shown. According to FIG. 13A the individual element 2 comprises two connection zones 5, which, when viewed in plan view, adjoin the semiconductor layer sequence 4 on opposite sides of the carrier 3. Thus, two of the end faces 45 of the semiconductor layer sequence 4 face the connection zones 5.

According to FIG. 13B the carrier 3 has a hexagonal outline in plan view. The semiconductor layer sequence 4 and thus also the sub-zone 30 are likewise hexagonal in shape. The connection zone 5 surrounds the semiconductor layer sequence 4 in the manner of a ring. According to FIG. 13C the semiconductor layer sequence 4 and the carrier 3 have a rhombic or parallelogram-like outline. Two of the end faces 45 of the semiconductor layer sequence 4 adjoin the connection zone 5. According to FIG. 13D the carrier 3 is L-shaped. The two connection zones 5a, 5b are formed in this way, which are separated from one another by the semiconductor layer sequence 4 and the sub-zone 30.

Figure 14:
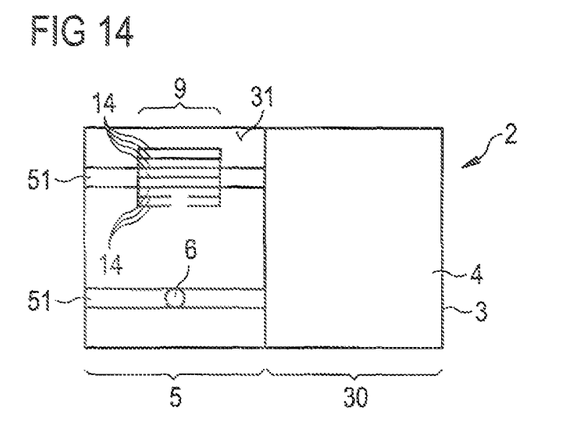

In the example according to FIG. 14, shown as a schematic plan view, the trimming resistor 9 on the carrier top 31 is formed by a set of conductor track sections 14 connected in parallel. A part of the conductor track sections 14 is severed, whereby the magnitude of the trimming resistor 9 may be adjusted.

Figure 15:
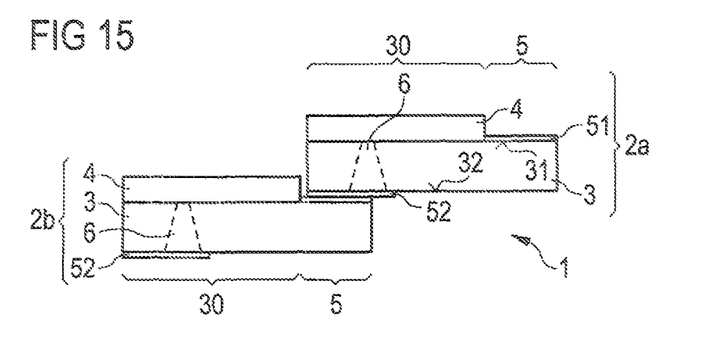
FIG. 15 is a schematic representation of a further example of an arrangement described herein.

The arrangement 1 according to the side view in FIG. 15 includes at least two individual elements 2, which each comprise just one conductor track 51, 52 on the carrier top 31 and on the carrier bottom 32 respectively. The conductor tracks 51, 52 are connected together electrically by the via 6, the via 6 being situated in the sub-zone 30.

The arrangement described herein is not restricted by the description given with reference to the examples. Rather, the arrangement encompasses any novel feature and any combination of features, including in particular any combination of features in the appended claims, even if the feature or combination is not explicitly indicated in the claims or examples.

The invention claimed is:

1. An arrangement of optoelectronic components comprising at least two individual optoelectronic elements, wherein
    at least one active semiconductor layer sequence is applied in a sub-zone of a carrier top of a carrier of the individual elements,
    at least one electrical conductor track is applied to the carrier top and at least one electrical conductor track is applied to a carrier bottom of the carrier,
    at least one of the conductor tracks on the carrier top extends into at least one connection zone not covered by the semiconductor layer sequence, and at least the at least one conductor track on the carrier bottom extends into the sub-zone, at least one of the conductor tracks on the carrier top is connected electrically to the conductor track on the carrier bottom by way of at least one via, wherein at least two of the individual elements overlap partially in a lateral direction, and at least indirect electrical contacting between at least two of the laterally overlapping individual elements is brought about by at least one of the conductor tracks on the carrier top of the one individual element and by the at least one conductor track on the carrier bottom of the other individual element.

2. The arrangement according to claim 1, wherein at least two of the individual elements comprise at least two conductor tracks on the carrier bottom, and the at least two individual elements are connected electrically in parallel.

3. The arrangement according to claim 1, wherein at least two of the individual elements comprise precisely one conductor track on the carrier bottom, and the at least two individual elements are connected electrically in series.

4. The arrangement according to claim 1, wherein the individual elements are mounted on a common mounting support, and the mounting support comprises a stepped structure on which at least two of the individual elements are mounted.

5. The arrangement according to claim 1, wherein the individual elements are mounted on a common mounting support, at least two of the individual elements are arranged obliquely relative to a mounting surface of the mounting support and the carrier bottom of the individual elements is. in contact in places with the mounting surface.

6. The arrangement according to claim 1, comprising a plurality of individual elements, at least some of-which are arranged next to one another in at least two rows.

7. The arrangement according to claim 1, comprising a plurality of individual elements, at least some of which are arranged as shingles.

8. The arrangement according to claim 1, comprising at least three individual elements in which a third individual element of the individual elements is contacted electrically by a first two individual elements arranged next to one another in a lateral direction, and wherein the third individual element is arranged overlapping connection zones of the first two individual elements:

9. The arrangement according to claim 1, comprising at least two individual elements in which the active semiconductor layer sequence takes up a proportion of an area of the carrier top of between 40% and 95% inclusive.

10. The arrangement according to claim 1, comprising at least two individual elements in which at least two end faces of the active semiconductor layer sequence adjoin the connection zone.

11. The arrangement according to claim 1, comprising at least two individual elements in which the carrier is different from a growth substrate of the active semiconductor layer sequence and the active semiconductor layer sequence has a thickness of at most 40 µm.

12. The arrangement according to claim 1, wherein the carrier or at least two of the individual elements has a triangular, rectangular or hexagonal outline and the individual elements are arranged symmetrically relative to at least one plane of symmetry.

13. The arrangement according to claim 1, wherein at least two of the individual elements comprises at least one electronic component which extends at least partially into the connection zone and which is integrated at least partially into the carrier.

14. The arrangement according to claim 13, wherein the at least one electronic component is an, integrated circuit.

15. The arrangement according to claim 13, wherein individual elements comprising the electrical components assemble into an overall system for an electrical circuit.

16. The arrangement according to claim 15, wherein the overall system is a drivable display.

17. The arrangement according to claim 1, wherein at least two of the individual elements comprise a trimming resistor, a Schottky diode and/or a Zener diode.

* * * * *

UNITED STATES PATENT AND TRADEMARK OFFICE
CERTIFICATE OF CORRECTION

PATENT NO. : 8,497,517 B2  Page 1 of 1
APPLICATION NO. : 13/201954
DATED : July 30, 2013
INVENTOR(S) : Herrmann It is certified that error appears in the above-identified patent and that said Letters Patent is hereby corrected as shown below:

In the Claims

<u>In Column 11</u>

In Claim 5, line 33, cancel the text "elements is. in" and replace it with --elements is in--.

In Claim 6 , line 36, cancel the text "some of-which" and replace it with --some of which--.

<u>In Column 12</u>

In Claim 8, line 7, cancel the text "individual elements:" and replace it with --individual elements.--.

In Claim 14, line 32, cancel the text "an, integrated circuit" and replace it with --an integrated circuit--.

Signed and Sealed this
Fourth Day of March, 2014

Michelle K. Lee
*Deputy Director of the United States Patent and Trademark Office*